US012564056B2

(12) United States Patent  (10) Patent No.: US 12,564,056 B2
Hsu et al.  (45) Date of Patent: Feb. 24, 2026

(54) INNER LEAD STRUCTURE OF FLEXIBLE CIRCUIT BOARD

(71) Applicant: CHIPBOND TECHNOLOGY CORPORATION, Hsinchu (TW)

(72) Inventors: Wen-Ping Hsu, Kaohsiung City (TW); Yi-Ling Hsieh, Kaohsiung City (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 234 days.

(21) Appl. No.: 18/617,880

(22) Filed: Mar. 27, 2024

(65) Prior Publication Data

US 2025/0038129 A1  Jan. 30, 2025

(30) Foreign Application Priority Data

Jul. 25, 2023  (TW) ................................. 112127840

(51) Int. Cl.
*H05K 1/11* (2006.01)
*H01L 23/00* (2006.01)
*H01L 23/498* (2006.01)

(52) U.S. Cl.
CPC ...... *H01L 23/562* (2013.01); *H01L 23/49838* (2013.01); *H05K 1/11* (2013.01); *H01L 23/4985* (2013.01)

(58) Field of Classification Search
CPC .......... H05K 1/11; H05K 1/118; H05K 1/116; H05K 1/182; H05K 1/181; H05K 1/189;
(Continued)

(56) References Cited

U.S. PATENT DOCUMENTS

2007/0109759 A1* 5/2007 Torii ................. H01L 23/49838
257/E23.07
2009/0096069 A1* 4/2009 Ishimaru ........... H01L 23/49838
257/666
2023/0044473 A1 2/2023 Lin et al.

FOREIGN PATENT DOCUMENTS

JP  2009-027135 A  2/2009
JP  2011-029601 A  2/2011
(Continued)

OTHER PUBLICATIONS

Taiwanese office action mailed Jul. 11, 2024 for Taiwanese Patent Application No. 112127840, 6 pages.
(Continued)

*Primary Examiner* — Roshn K Varghese
(74) *Attorney, Agent, or Firm* — Demian K. Jackson; Jackson IPG PLLC

(57) ABSTRACT

An inner lead structure of a flexible circuit board includes a flexible substrate, a circuit layer and a dummy circuit layer. A chip mounting area defined on the flexible substrate is provided for a chip, contacting locations defined within the chip mounting area are provided for conductive elements of the chip. The circuit layer includes inner leads, ends of the inner leads are arranged on the contacting locations and provided to be electrically connected to the conductive elements. At least one of first dummy lines of the dummy circuit layer is arranged in a space between the adjacent inner leads. The space having a distance greater than 50 um is divided into multiple spaces having distances not greater than 50 um. Proportion of the spaces without the first dummy lines and having a distance greater than 50 um is less than 0.5% in all spaces.

13 Claims, 6 Drawing Sheets

(58) Field of Classification Search
CPC .......... H05K 2201/09409; H05K 2201/09781;
H05K 3/202; H01L 23/562; H01L
23/49838; H01L 23/4985
See application file for complete search history.

(56) References Cited

FOREIGN PATENT DOCUMENTS

| | | | |
|---|---|---|---|
| JP | 2013-239653 | A | 11/2013 |
| KR | 10-2014-0062607 | A | 5/2014 |
| KR | 10-2022-0035895 | A | 3/2022 |
| KR | 10-2022-0043823 | A | 4/2022 |
| TW | I705748 | B | 9/2020 |
| TW | I748668 | B | 12/2021 |
| TW | 202214053 | A | 4/2022 |
| TW | I776631 | B | 9/2022 |

OTHER PUBLICATIONS

Taiwanese invalidation document provided by invalidation requester for Taiwanese utility model No. M651423 (filing No. 112207839), mailed May 28, 2024, 73 pages.
Korean office action mailed Nov. 18, 2024 for Korean patent application No. 10-2023-0129190, 8 pages.
Japanese office action mailed Dec. 4, 2024 for Japanese patent application No. 2023-163592, 5 pages.
Korean office action mailed Jul. 16, 2025 for Korean patent application No. 10-2023-0129190, 8 pages.

* cited by examiner

INNER LEAD STRUCTURE OF FLEXIBLE CIRCUIT BOARD

CROSS-REFERENCE TO RELATED APPLICATIONS

This application claims priority to R.O.C patent application No. 112127840 filed Jul. 25, 2023, the disclosure of which is hereby incorporated by reference in its entirety.

FIELD OF THE INVENTION

This invention relates to a flexible circuit board, and more particularly to an inner lead structure of a flexible circuit board.

BACKGROUND OF THE INVENTION

Flexible circuit board is appropriate to be mounted in light and thin electronic products. Conventional flexible circuit board includes a flexible substrate and circuit lines arranged on the flexible substrate. A chip mounting area defined on the flexible substrate is provided for placement of a chip, some of the circuit lines are extended in the chip mounting area and provided to be joined with bumps of the chip for signal transmission. The circuit lines in the chip mounting area are known as inner leads which are provided to electrically connect the chip to the other circuit lines. The bumps may be arranged on the chip in different patterns based on their functions, so spaces between the adjacent bumps are not equal, and spaces between the adjacent inner leads are also varied.

The circuit lines are usually formed on the flexible substrate through wet etching. An etching solution is running to etch a metal layer not covered by a patterned photoresist, and the metal layer covered by the patterned photoresist is remained to become the circuit lines. Because the inner leads are designed to be arranged in different intervals, the patterned photoresist has to be designed to have different passageways in size, and the etching solution runs through the different passageways at different speeds. The metal layer may be etched nonuniformly by the etching solution running at varied speeds to form the inner leads with varied widths. Moreover, the inner leads arranged in larger intervals may be etched to be trapezoidal (narrow at the top and wide at the bottom) in cross-section view by the etching solution running faster.

SUMMARY OF THE INVENTION

One object of the present invention is to provide dummy line(s) in a larger space between inner leads to allow the space between the adjacent inner leads to have a distance less than or equal to 50 um, thereby avoiding etching solution from flowing inconsistently.

An inner lead structure of a flexible circuit board of the present invention includes a flexible substrate, a circuit layer and a dummy circuit layer. A chip mounting area is defined on a top surface of the flexible substrate and provided for placement of a chip. Contacting locations are defined within the chip mounting area and provided for placement of conductive elements of the chip. The circuit layer arranged on the top surface includes inner leads, and ends of the inner leads are arranged on the contacting locations defined within the chip mounting area such that the inner leads can be electrically connected to the conductive elements. Spaces exists between the adjacent inner leads, some of the spaces have a distance greater than 50 um and the others have a distance not greater than 50 um. The dummy circuit layer arranged on the top surface includes first dummy lines which are designed not to be electrically connected to the conductive elements. At least one of the first dummy lines is arranged in the space having the distance greater than 50 um to divide the space into multiple spaces having a distance not greater than 50 um. Proportion of the other spaces without the first dummy lines and having a distance greater than 50 um is less than 0.5% in all of the spaces.

Because of the first dummy lines, the larger space having the distance greater than 50 um is divided into two or more smaller spaces having the distance not greater than 50 um. Proportion of the spaces without the first dummy lines and having the distance greater than 50 um is less than 0.5% in all spaces, such that etching solution can run through the spaces slowly and smoothly to avoid the inner leads from being etched to be trapezoidal.

BRIEF DESCRIPTION OF DRAWINGS

FIG. 6 is a top view diagram illustrating a part of an inner lead structure of flexible circuit board in accordance with a third embodiment of the present invention.

DETAILED DESCRIPTION OF THE INVENTION

Figure 1:
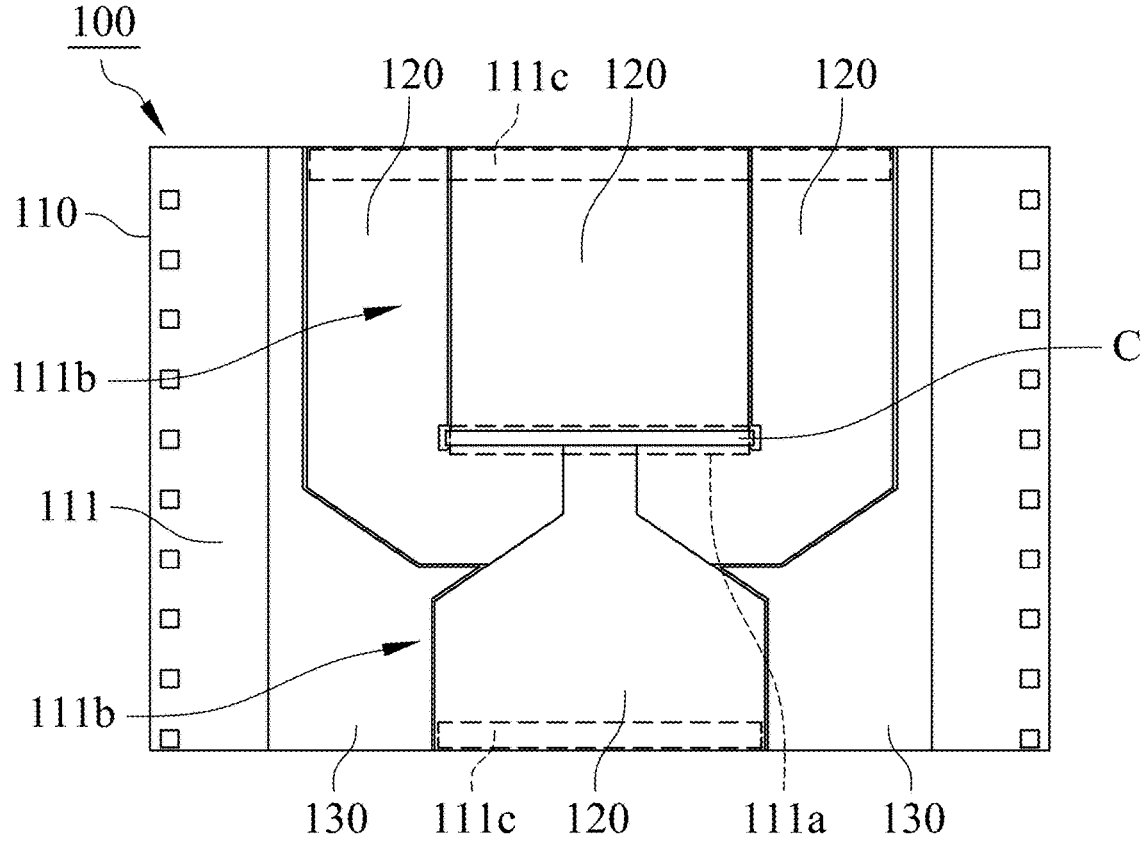
FIG. 1 is a top view diagram illustrating an inner lead structure of flexible circuit board in accordance with one embodiment of the present invention.

FIG. 1 is a top view diagram illustrating an inner lead structure of a flexible circuit board 100 in accordance with one embodiment of the present invention. The inner lead structure of the flexible circuit board 100 includes a flexible substrate 110, a circuit layer 120 and a dummy circuit layer 130 which are arranged on a top surface 111 of the flexible substrate 110. The circuit layer 120 and the dummy circuit layer 130 includes fine circuit lines and are simplified as blank blocks in FIG. 1. The dummy circuit layer 130 located on both sides of the circuit layer 120 is not provided for single transmission, it is provided to improve mechanical strength of the flexible substrate 110 for different processes.

Figure 2:
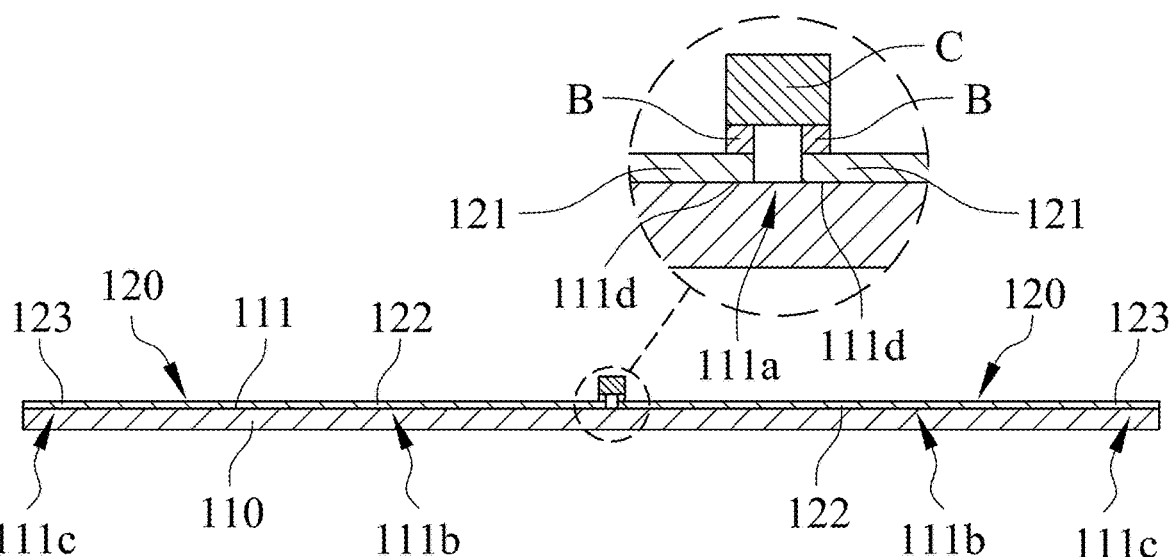
FIG. 2 is a cross-section view diagram illustrating an inner lead structure of flexible circuit board in accordance with one embodiment of the present invention.

FIG. 2 is a cross-section view of the inner lead structure of the flexible circuit board 100. As shown in FIGS. 1 and 2, a chip mounting area 111a, a transmission line area 111b and an outer lead area 111c are defined on the top surface 111 of the flexible substrate 110. The chip mounting area 111*a* is located near center of the top surface 111, the outer lead area 111*c* is located on both ends (top and bottom) of the top surface 111, and the transmission line area 111*b* is located between the chip mounting area 111*a* and the outer lead area 111*c*. A chip C includes multiple conductive elements B which are but not limit to bumps or solder balls and formed on the chip C in advance. While the chip C is mounted on the chip mounting area 111*a*, the conductive elements B are aligned to contacting locations 111*d* defined within the chip mounting area 111*a*.

The circuit layer 120 includes inner leads 121, transmission lines 122 and outer leads 123. The inner leads 121 are arranged adjacent to the chip mounting area 111*a* and some of them are extended to the chip mounting area 111*a*, the outer leads 123 are arranged on the outer lead area 111*c*, the transmission lines 122 are arranged on the transmission line area 111*b*, and both ends of each of the transmission lines 122 are connected to one of the inner leads 121 and one of the outer leads 123 for electrical connection between the inner leads 121 and the outer leads 123. Preferably, a copper foil plated on the top surface 111 is etched to become the inner leads 121, the transmission lines 122 and the outer leads 123.

Figures 3, 4:
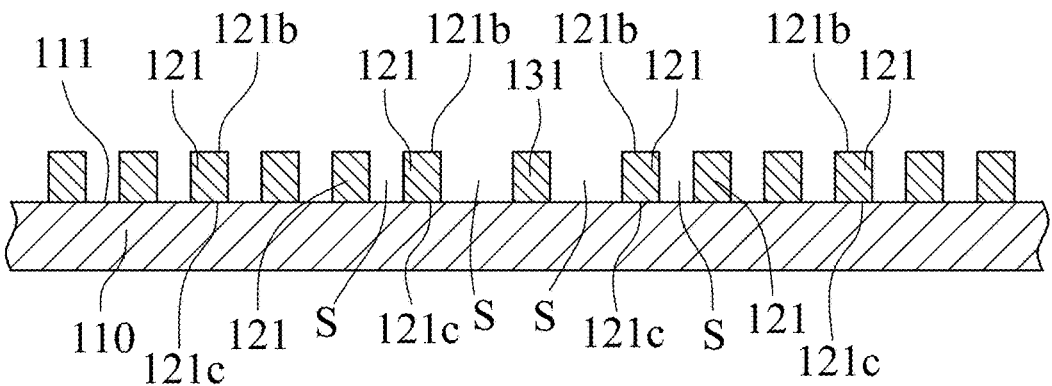
FIG. 3 is a top view diagram illustrating a part of an inner lead structure of flexible circuit board in accordance with a first embodiment of the present invention.
FIG. 4 is a cross-section view diagram illustrating a part of the inner lead structure of flexible circuit board in accordance with the first embodiment of the present invention.

FIG. 3 is a top view diagram showing parts of the chip mounting area 111*a* and the transmission line area 111*b* defined on the inner lead structure of the flexible circuit board 100 in accordance with a first embodiment of the present invention. The area above a horizontal dotted line in FIG. 3 is the chip mounting area 111*a*, and the area below the horizontal dotted line is the transmission line area 111*b*. With reference to FIGS. 2 and 3, an end 121*a* of each of the inner leads 121 is extended to the chip mounting area 111*a* and located on one of the contact locations 111*d* such that the inner leads 121 can be electrically connected to the conductive elements B as the chip C is mounted on the chip mounting area 111*a*. While the chip C is mounted on the chip mounting area 111*a* by thermal compression, the end 121*a* of each of the inner leads 121 is eutectic connected to one of the conductive elements B which may be made of tin and alloy of other metals, so the chip C can be electrically connected to the circuit layer 120. Owing to distances between the adjacent conductive elements B on the chip C are different, distances of spaces S between some of the adjacent inner leads 121 are designed to be greater than 50 um and the others are designed to be less than or equal to 50 um in this embodiment. Only one of the spaces S having the distance greater than 50 um is shown in FIG. 3 which is provided to show a part of the chip mounting area 111*a*. Actually, there is more than one space S having the distance greater than 50 um within the chip mounting area 111*a* according to arrangement design of the conductive elements B of the chip C.

With reference to FIG. 3, the dummy circuit layer 130 includes first dummy lines 131 which are not electrically connected to any one of the conductive elements B. At least one of the first dummy lines 131 is provided in the space S having the distance greater than 50 um to divide the space S into multiple smaller spaces S having distances not greater than 50 um. Proportion of the other spaces S without the first dummy lines 131 and having the distance greater than 50 um is less than 0.5% in all spaces S, and a ratio of the largest distance to the smallest distance of the spaces S is less than 6, thereby allowing spaces between the adjacent leads near the chip mounting area 111*a* to have similar distances.

In this embodiment, more than 99.5% spaces S between the adjacent inner leads 121 have the distances not greater than 50 um because of the first dummy lines 131 provided in the spaces S having the distances greater than 50 um. The inner leads 121, the transmission lines 122 and the outer leads 123 are formed by wet etching process, an etching solution can run through the spaces S between the adjacent inner leads 121 at similar speeds during wet etching process to avoid the inner leads 121 from having different widths caused by different etching degrees. Furthermore, the distances of the spaces S between the adjacent inner leads 121 are adjusted to be less than or equal to 50 um by the first dummy lines 131, so the etching solution can run through the spaces S smoothly and slowly to generate rectangular inner leads 121 and the first dummy lines 131 in cross-sectional view. The inner leads 121 and the first dummy lines 131 will not be etched to become trapezoid in cross-sectional view (narrow at the top and wide at the bottom) by the etching solution running quickly.

Referring to FIG. 4, in practical, the inner leads 121 and the first dummy lines 131 formed by isotropic wet etching are not geometric rectangle in cross-section, only similar to rectangular shapes. Each of the inner leads 121 has a first exposed surface 121*b* and a first connection surface 121*c* which is connected to the top surface 111 of the flexible substrate 110. In the present invention, the inner leads 121 are defined as rectangular in cross-section view while a difference between widths of the first connection surface 121*c* and the first exposed surface 121*b* is less than 2 um. In the same way, cross-section profile of each of the first dummy lines 131 is regarded as rectangular when a difference between widths of a connection surface and an exposed surface of the first dummy lines is less than 2 um.

Referring to FIG. 3, the first dummy lines 131 are preferably designed to have a width W from 6 um to 100 um and a length L of greater than 70 um in order to prevent the first dummy lines 131 from affecting flowability of underfill below the chip C and avoid stress concentration on the flexible substrate 110 resulted from the first dummy lines 131.

Figure 5:
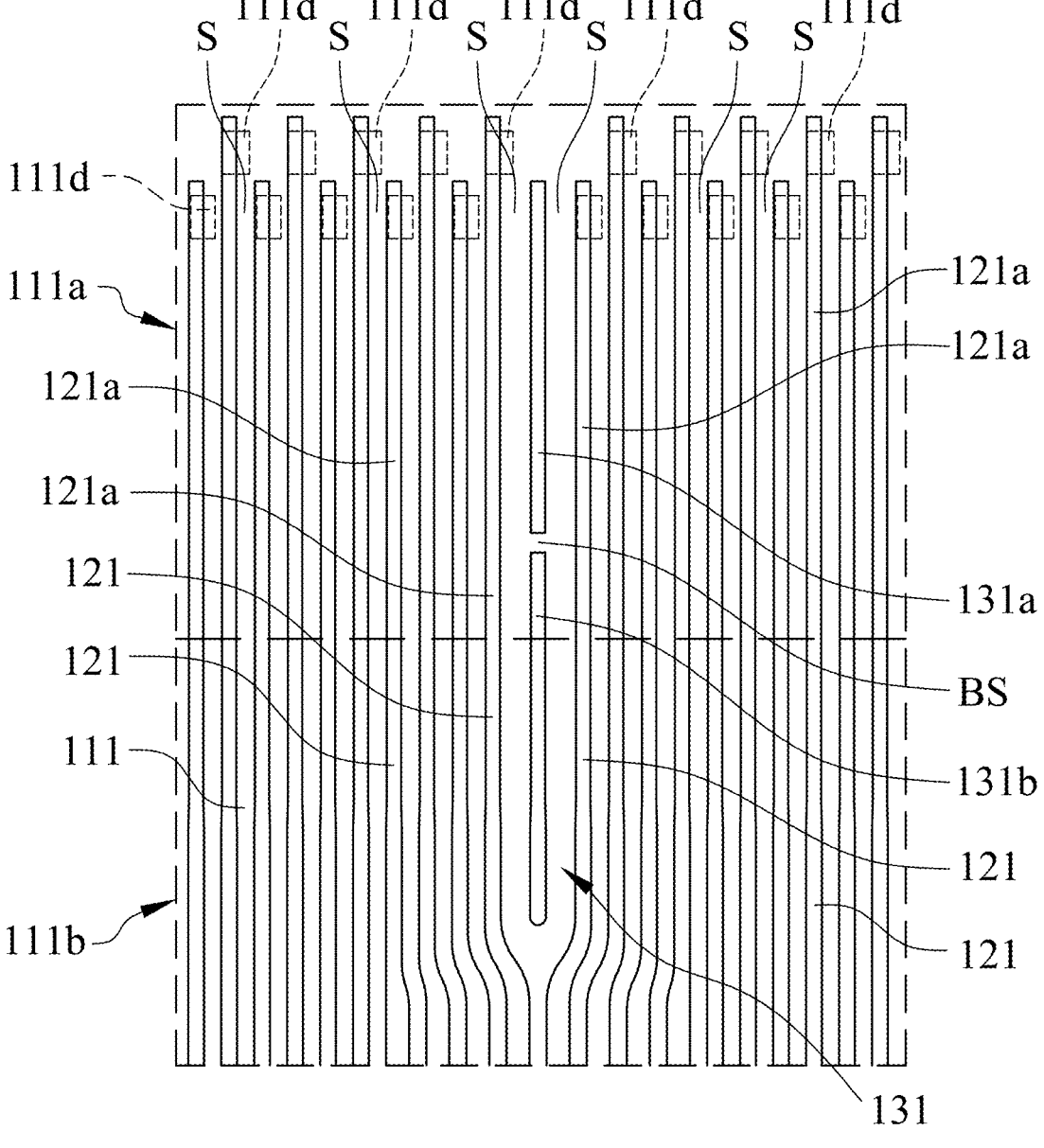
FIG. 5 is a top view diagram illustrating a part of an inner lead structure of flexible circuit board in accordance with a second embodiment of the present invention.

A part of an inner lead structure of a flexible circuit board 100 of a second embodiment is shown in FIG. 5. Each of the first dummy lines 131 includes a first part 131*a* and a second part 131*b* which are parallel to the inner leads 121 in the second embodiment. A gap BS exists between the first part 131*a* and the second part 131*b* and it has a width between 10 um and 30 um. In the second embodiment, each of the first dummy lines 131 is divided into two parts such that underfill can flow through the gap BS between the two parts of each of the first dummy lines 131 and can flow smoothly with lower interference of the first dummy lines 131.

Figure 6:
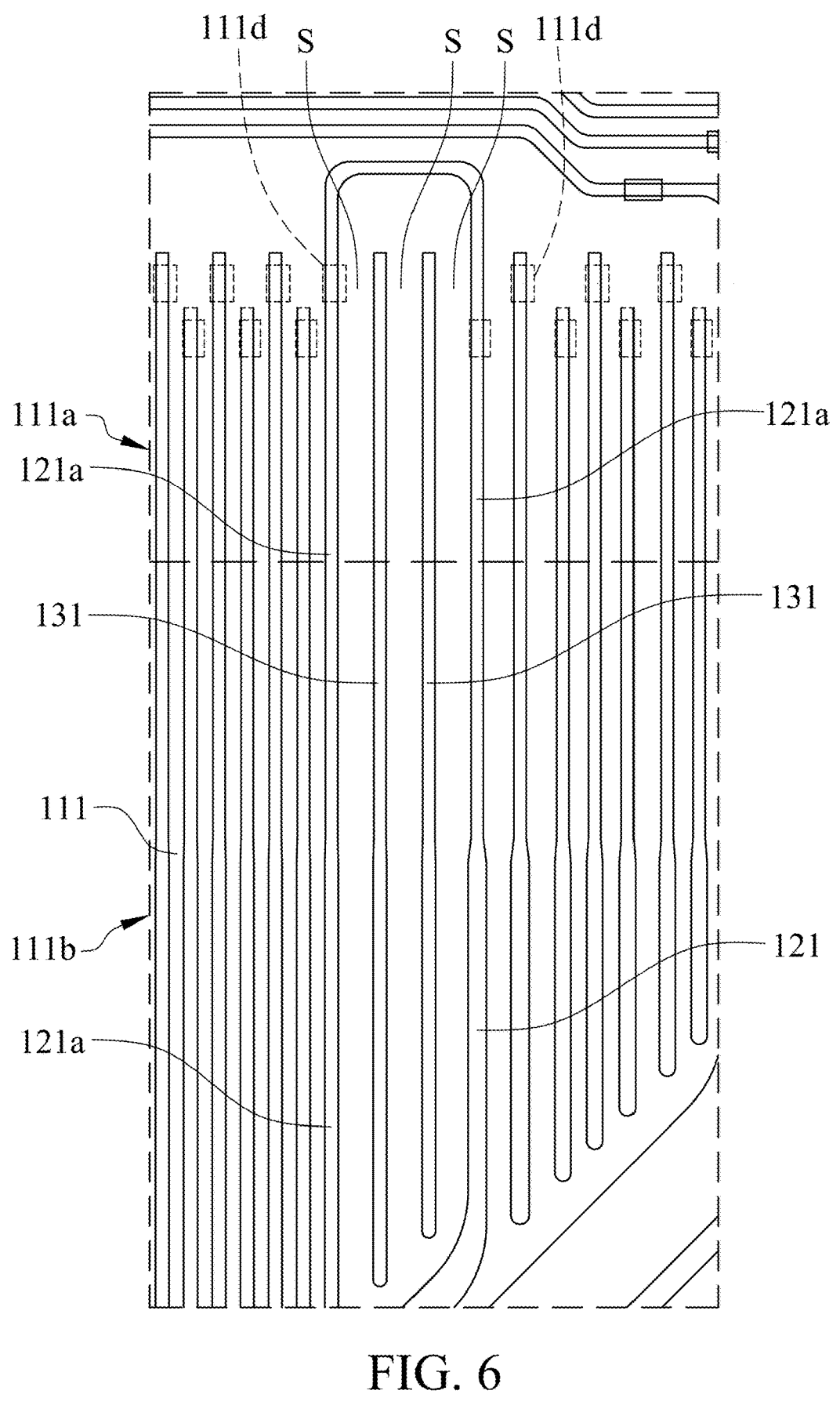

FIG. 6 represents a part of an inner lead structure of a flexible circuit board 100 in accordance with a third embodiment of the present invention. In the third embodiment, multiple first dummy lines 131 are provided in one space S having the distance greater than 50 um to divide the larger space S into multiple smaller spaces S having a distance less than or equal to 50 um. Widths of the first dummy lines 131 arranged in the space S having the distance greater than 50 um are preferably reduced to avoid stress concentration on the flexible substrate 110 and further avoid the chip C from peeling off during thermal compression process.

Figure 7:
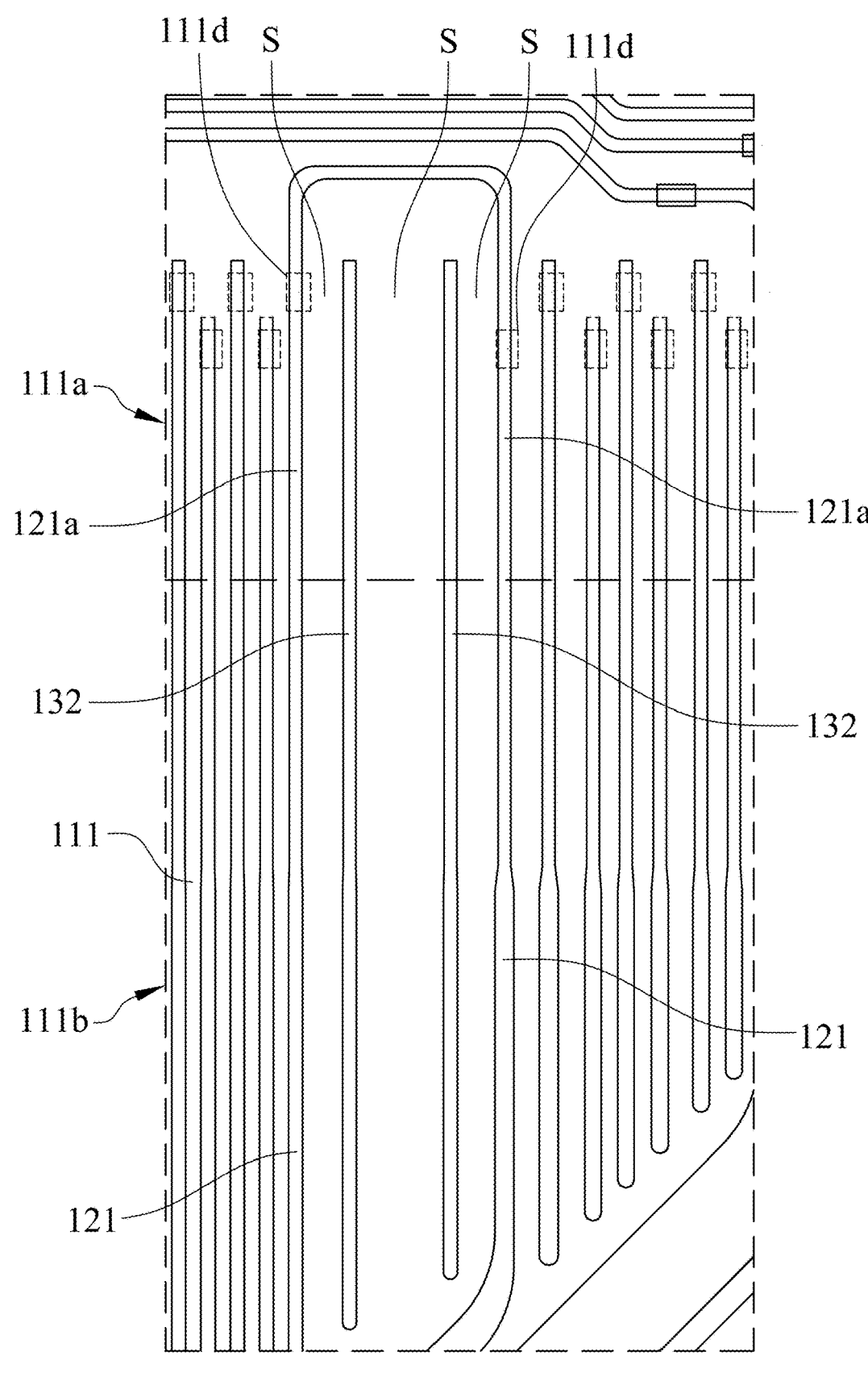
FIG. 7 is a top view diagram illustrating a part of an inner lead structure of flexible circuit board in accordance with a fourth embodiment of the present invention.
Figure 8:
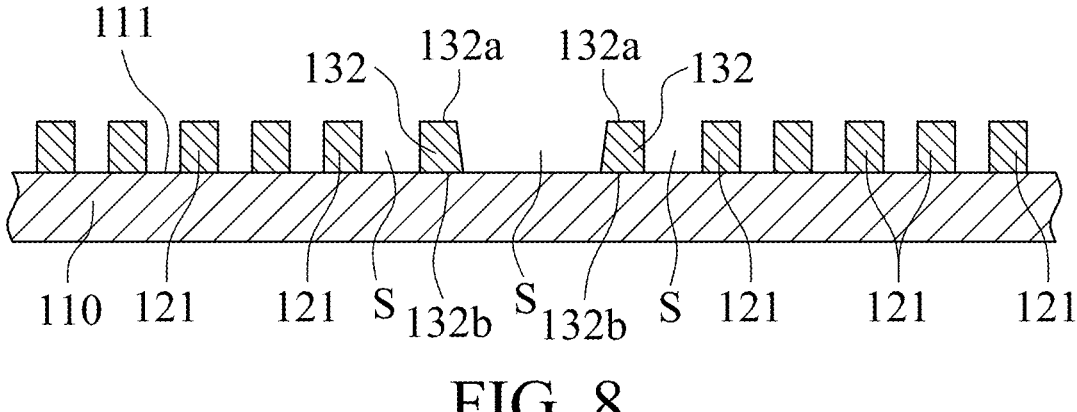
FIG. 8 is a cross-section view diagram illustrating a part of the inner lead structure of flexible circuit board in accordance with the fourth embodiment of the present invention.

As shown in FIG. 7, the dummy layer 130 further includes at least one second dummy line 132 not electrically connected to any one of the conductive elements B in a fourth embodiment of the present invention. The second dummy line 132 is arranged in the space S having the distance greater than 50 um to divide the space S into a space S having a distance not greater than 50 um and a space S having a distance greater than 50 um. Restrictive to circuit layout design, one or more first dummy lines 131 are unable to divide the space S having the distance greater than 50 um into multiple spaces S having the distance not greater than 50 um in this embodiment. Consequently, the second dummy line 132 is arranged in the space S and used as the sacrifice line to protect the inner leads 121. With reference to FIGS. 7 and 8, flow rate of the etching solution running through the divided space S having the distance greater than 50 um is faster than that through the divided space S having the distance not greater than 50 um during wet etching process. The second dummy line 132 may be etched to become trapezoid in cross-section (narrow at the top and wide at the bottom) by the etching solution running faster, but the inner lead 121 near the second dummy line 132 can be close to the space S having the distance not greater than 50 um and etched by the etching solution running at appropriate speed. For this reason, cross-section profile of the inner lead 121 near the second dummy line 132 is still rectangular.

The second dummy line 132 has a second exposed surface 132*a* and a second connection surface 132*b* which is connected to the top surface 111 of the flexible substrate 110. In the fourth embodiment, the second dummy line 132 is a sacrifice line which is etched to be trapezoidal shape in cross-section, so the second connection surface 132*b* is wider than the second exposed surface 132*a* in width, and a difference between the widths of the second connection surface 132*b* and the second exposed surface 132*a* is greater than 2 um.

If there is only one second dummy line 132 provided in each of the spaces S between the adjacent inner leads 121, one of the two inner leads 121 which is closer to the second dummy line 132 can be protected by the second dummy line 132, but the other inner lead 121 which is farther from the second dummy line 132 is still etched by the etching solution running faster. Preferably, the dummy circuit layer 130 includes at least two second dummy lines 132 in the fourth embodiment. The two second dummy lines 132 are provided in the same space S having the distance greater than 50 um to divide the space S into two or more smaller spaces S having the distance not greater than 50 um and one larger space S having the distance greater than 50 um. Each of the divided spaces S having the distance not greater than 50 um is located between one of the second dummy lines 132 and one of the inner leads 121, and the divided space S having the distance greater than 50 um is located between the second dummy lines 132. In this embodiment, the second dummy lines 132 are provided to divide the space S to allow the inner leads 121 located at both sides of the space S to be close to the divided space S having the distance less than or equal to 50 um, thereby preventing the inner leads 121 from being etched by the etching solution running faster to become trapezoid in cross-sectional view.

In the present invention, at least one first dummy line 131 is provided in the space S having a distance greater than 50 um to divide the space S into multiple narrower spaces S each having a distance not greater than 50 um. Proportion of the other spaces S without the first dummy lines 131 and having a distance greater than 50 um is controlled to be less than 0.5% in all spaces S, thereby allowing the etching solution to run slowly in the wider spaces S and avoiding the inner leads 121 from being etched to irregular shapes.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

The invention claimed is:

1. An inner lead structure of flexible circuit board comprising:
   a flexible substrate including a top surface, a chip mounting area is defined on the top surface and is configured for placement of a chip which includes a plurality of conductive elements, a plurality of contacting locations are defined within the chip mounting area and configured for placement of the plurality of conductive elements;
   a circuit layer disposed on the top surface and including a plurality of inner leads, an end of each of the plurality of inner leads is located on one of the plurality of contacting locations defined within the chip mounting area and is configured to be electrically connected to one of the plurality of conductive elements, wherein some spaces between the adjacent inner leads have a distance greater than 50 um, and the other spaces between the adjacent inner leads have a distance less than or equal to 50 um; and
   a dummy circuit layer disposed on the top surface and including a plurality of first dummy lines, the plurality of first dummy lines are configured not to be electrically connected to any one of the plurality of conductive elements, at least one of the plurality of first dummy lines is arranged in one of the spaces having the distance greater than 50 um to divide the space into a plurality of spaces having a distance less than or equal to 50 um, wherein proportion of the spaces without any one of the plurality of first dummy lines and having the distance greater than 50 um is less than 0.5% in all of the spaces.

2. The inner lead structure of flexible circuit board in accordance with claim 1, wherein the dummy circuit layer further includes at least one second dummy line which is configured not to be electrically connected to any one of the plurality of conductive elements, the at least one second dummy line is arranged in one of the spaces having the distance greater than 50 um to divide the space into a space having a distance less than or equal to 50 um and a space having a distance greater than 50 um, the at least one second dummy line is trapezoid in cross-section view.

3. The inner lead structure of flexible circuit board in accordance with claim 2, wherein the dummy circuit layer includes at least two second dummy lines, the at least two second dummy lines are arranged in one of the spaces having the distance greater than 50 um to divide the space into a plurality of spaces having a distance less than or equal to 50 um and a space having a distance greater than 50 um, each of the plurality of spaces having the distance less than or equal to 50 um is located between one of the at least two second dummy lines and one of the plurality of inner leads, and the space having the space greater than 50 um is located between the at least two second dummy lines.

4. The inner lead structure of flexible circuit board in accordance with claim 3, wherein each of the plurality of inner leads has a first exposed surface and a first connection surface which is connected to the top surface of the flexible substrate, a difference between widths of the first connection surface and the first exposed surface is less than 2 um.

5. The inner lead structure of flexible circuit board in accordance with claim 4, wherein each of the at least two second dummy lines has a second exposed surface and a second connection surface which is connected to the top surface of the flexible substrate, a width of the second connection surface is greater than a width of the second exposed surface, and a difference between the widths of the second connection surface and the second exposed surface is greater than 2 um.

6. The inner lead structure of flexible circuit board in accordance with claim 3, wherein each of the plurality of inner leads adjacent to one of the at least two second dummy lines is rectangular in cross-section view.

7. The inner lead structure of flexible circuit board in accordance with claim 2, wherein each of the plurality of inner leads has a first exposed surface and a first connection surface which is connected to the top surface of the flexible substrate, a difference between widths of the first connection surface and the first exposed surface is less than 2 um.

8. The inner lead structure of flexible circuit board in accordance with claim 7, wherein the at least one second dummy line has a second exposed surface and a second connection surface which is connected to the top surface of the flexible substrate, a width of the second connection surface is greater than a width of the second exposed surface, and a difference between the widths of the second connection surface and the second exposed surface is greater than 2 um.

9. The inner lead structure of flexible circuit board in accordance with claim 2, wherein each of the plurality of inner leads adjacent to the at least one second dummy line is rectangular in cross-section view.

10. The inner lead structure of flexible circuit board in accordance with claim 1, wherein a ratio of the largest distance to the smallest distance of the spaces is less than 6.

11. The inner lead structure of flexible circuit board in accordance with claim 1, wherein each of the plurality of first dummy lines has a width from 6 um to 100 um and has a length greater than 70 um.

12. The inner lead structure of flexible circuit board in accordance with claim 1, wherein each of the plurality of first dummy lines includes a first part and a second part which are parallel to the plurality of inner leads, there is a gap between the first and second parts, and a width of the gap is between 10 um and 30 um.

13. The inner lead structure of flexible circuit board in accordance with claim 1, wherein more than one of the plurality of first dummy lines are arranged in one of the spaces having the distance greater than 50 um to divide the space into a plurality of spaces having a distance less than or equal to 50 um.

* * * * *